US010950000B2

(12) United States Patent
Hokazono et al.

(10) Patent No.: US 10,950,000 B2
(45) Date of Patent: *Mar. 16, 2021

(54) CONDUCTIVE-WIRE POSITION INSPECTING METHOD AND DEVICE

(71) Applicant: HONDA MOTOR CO., LTD., Tokyo (JP)

(72) Inventors: Hidetaka Hokazono, Tochigi-ken (JP); Yoshiyuki Izumi, Tochigi-ken (JP); Yasuyuki Kimura, Tochigi-ken (JP); Masahiko Kamiyama, Tochigi-ken (JP); Naoki Ito, Tochigi-ken (JP); Yutaka Matsumoto, Tochigi-ken (JP); Daisuke Ueno, Tochigi-ken (JP)

(73) Assignee: HONDA MOTOR CO., LTD., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/788,367

(22) Filed: Feb. 12, 2020

(65) Prior Publication Data

US 2020/0184680 A1 Jun. 11, 2020

Related U.S. Application Data

(63) Continuation of application No. 16/243,178, filed on Jan. 9, 2019, now Pat. No. 10,593,061.

(30) Foreign Application Priority Data

Jan. 16, 2018 (JP) .............................. JP2018-004717

(51) Int. Cl.
*G06T 7/73* (2017.01)
*H04N 7/18* (2006.01)
*G06T 7/00* (2017.01)
*G01R 31/34* (2020.01)

(52) U.S. Cl.
CPC ................ *G06T 7/74* (2017.01); *G01R 31/34* (2013.01); *G06T 7/001* (2013.01); *H04N 7/183* (2013.01); *G06T 2207/30136* (2013.01)

(58) Field of Classification Search
None
See application file for complete search history.

(56) References Cited

FOREIGN PATENT DOCUMENTS

| JP | 03-276007 | 12/1991 |
|---|---|---|
| JP | 2014-135819 | 7/2014 |

OTHER PUBLICATIONS

Japanese Office Action for Japanese Patent Application No. 2018-004717 dated Sep. 3, 2019.

*Primary Examiner* — Christopher Braniff
(74) *Attorney, Agent, or Firm* — Amin, Turocy & Watson LLP

(57) ABSTRACT

A conductive-wire position inspecting device includes: a reference body disposed in a radial direction of a stator core; an imaging device configured to image a conductive wire and the reference body; and a calculating device configured to find a relative position and a relative angle of the conductive wire with respect to the reference body, based on an obtained image. In addition, the conductive-wire position inspecting device includes a determining device configured to determine whether or not the found relative position and relative angle are within respective permissible ranges, and if they are within the permissible ranges, determine the position of the conductive wire to be acceptable.

6 Claims, 4 Drawing Sheets

CONDUCTIVE-WIRE POSITION INSPECTING METHOD AND DEVICE

CROSS-REFERENCE TO RELATED APPLICATIONS

This application is a Continuation of application Ser. No. 16/243,178 filed on Jan. 9, 2019, the entire contents of which are incorporated herein by reference.

This application is based upon and claims the benefit of priority from Japanese Patent Application No. 2018-004717 filed on Jan. 16, 2018, the contents of which are incorporated herein by reference.

BACKGROUND OF THE INVENTION

Field of the Invention

The present invention relates to a conductive-wire position inspecting method for inspecting whether or not a position of a conductive wire inserted in a slot of a stator core is within a reference range, and also to a conductive-wire position inspecting device.

Description of the Related Art

There is known a stator in which two of a plurality of slots formed along a circumferential direction of a circular ring shaped stator core have inserted therein a segment-for-coil (hereafter, also expressed simply as a "segment") which is a conductive wire. Now, the segment is substantially U-shaped, having a first leg, a second leg that extends substantially in parallel to the first leg, and a turn section that bends so as to connect the first leg with the second leg. The plurality of slots are formed radially, so when the first leg and the second leg are inserted in the slot in order to manufacture the stator, for example, the first leg faces an inner circumferential side of the stator core, and the second leg faces an outer circumferential side of the stator core.

It is required that positions of tips of the first leg and the second leg projecting from the slot are within a certain reference value with respect to the circumferential direction and a radial direction of the stator core. This is because if a positional deviation falls outside the reference value, then when the segment is twisted to be joined to another leg, a strength of that joining will be insufficient.

Accordingly, after the first leg and the second leg have been inserted into the slot, an inspection of tip positions of the first leg and the second leg is performed. For example, Japanese Laid-Open Patent Publication No. 2014-135819 describes an inspection method that photographs a tip surface of a leg by an imaging device and finds a position of an intersection point of diagonal lines within the tip surface, and finds by calculation an amount of deviation between the intersection point position and a regular position.

SUMMARY OF THE INVENTION

The inspection method described in Japanese Laid-Open Patent Publication No. 2014-135819 is configured so as to find the intersection point at which the diagonal lines intersect by artificially assuming to be quadrangular the tip surface which originally is not quadrangular. Therefore, a complicated calculation must be performed. Moreover, since a calculation is performed for the tip surfaces of the individual legs, a long time is required until calculation on all of the legs finishes. That is, a defect of inspection efficiency being poor, is apparent.

A main object of the present invention is to provide a conductive-wire position inspecting method that enables a time from start to finish to be reduced.

Another object of the present invention is to provide a conductive-wire position inspecting device by which efficiency of the conductive-wire position inspecting method can be improved.

According to an aspect of the present invention, there is provided a conductive-wire position inspecting method for inspecting a position of a conductive wire inserted into a slot of a stator core, the method including:

a disposing step of disposing a reference body so that the reference body and the conductive wire projecting from the slot are arranged along a line in a radial direction of the stator core;

an imaging step of imaging the conductive wire and the reference body with an imaging device;

a calculating step of finding a relative position and a relative angle of the conductive wire with respect to the reference body, with a calculating device, based on an image obtained by the imaging device; and a determining step of, if the relative position and the relative angle found in the calculating step are within respective permissible ranges, determining the position of the conductive wire to be acceptable, with a determining device.

Moreover, according to another aspect of the present invention, there is provided a conductive-wire position inspecting device for inspecting a position of a conductive wire inserted into a slot of a stator core, the device including:

a reference body disposed so that the reference body and the conductive wire projecting from the slot are arranged along a line in a radial direction of the stator core;

an imaging device configured to image the conductive wire and the reference body;

a calculating device configured to find a relative position and a relative angle of the conductive wire with respect to the reference body, based on an image obtained by the imaging device;

and a determining device configured to, if the relative position and the relative angle found by the calculating device are within respective permissible ranges, determine the position of the conductive wire to be acceptable.

Thus, the present invention is configured such that the reference body serving as a reference of position is provided separately from the conductive wire, and the relative position and the relative angle of the conductive wire with respect to this reference body are found. That is, a deviation amount of the conductive wire with respect to the reference body is obtained by calculation, and it is determined whether or not this deviation amount is within the permissible range (the reference range). Therefore, there is no need for a calculation to be performed for each of the tip surfaces of the legs. In other words, calculation becomes simple. Accordingly, a reduction in time required for calculation may be achieved, and an improvement in inspection efficiency can be achieved.

In the calculating step, for example, a reference line extending along the radial direction of the stator core may be drawn from the reference body, and the relative position and the relative angle of the conductive wire with respect to this reference line may be found. Employing the reference line makes calculation even simpler.

It is preferable that when a plurality of the conductive wires are arranged along the radial direction of the stator core, a relative position and a relative angle of each of the plurality of conductive wires with respect to the reference body are found in the calculating step. As a result, it can be determined collectively whether or not the relative position and the relative angle are within the respective permissible ranges (the reference ranges) for the plurality of conductive wires. Therefore, inspection efficiency can be improved even more.

In some case, a plurality of the conductive wires are arranged along the circumferential direction of the stator core. In this case, after the position of one inspection target conductive wire is determined to be acceptable in the determining step, another conductive wire that is adjacent to the one conductive wire in the circumferential direction undergoes the imaging step, the calculating step, and the determining step. This makes it possible for an inspection to be performed on all of the conductive wires inserted in the slots of the stator core.

In order to configure such that the imaging step, the calculating step, and the determining step are sequentially performed on the conductive wires adjacent in the circumferential direction, a rotating device configured to rotate the stator core relatively to the imaging device may be provided. Note that the imaging device may be positioned and fixed, and the stator core may be rotated. Alternatively, the stator core may be positioned and fixed, and the imaging device may be rotated.

In all cases, the reference body is preferably positioned and fixed. In this case, it is avoided that the reference body undergoes a positional displacement with respect to the stator core. In other words, a relative position of the reference body with respect to the stator core is fixed.

In the case where the calculation is performed using the reference line, the reference line may be given by calculation with the calculating device. Alternatively, it is also possible for the reference line to be provided in the imaging device or a member interposed between the imaging device and the reference body. In this case, calculation for giving the reference line becomes unnecessary, so calculation becomes even simpler.

Due to the present invention, a configuration is adopted whereby a reference body serving as a reference of position is provided, a relative position and a relative angle of a conductive wire with respect to this reference body are found, and it is determined whether or not the relative position and the relative angle are within respective permissible ranges (a reference range). Because the reference body is used as a reference, there is no need for a calculation to be performed for each of the tip surfaces of the legs, and, proportionately, calculation becomes simple.

Therefore, a reduction in time required for calculation, and consequently, a reduction in time required from start to finish of inspection, can be achieved. As a result, an improvement in inspection efficiency can also be achieved.

The above and other objects, features, and advantages of the present invention will become more apparent from the following description when taken in conjunction with the accompanying drawings, in which a preferred embodiment of the present invention is shown by way of illustrative example.

DESCRIPTION OF THE PREFERRED EMBODIMENTS

A preferred embodiment of a conductive-wire position inspecting method in relation to a conductive-wire position inspecting device for implementing the method according to the present invention, will be presented and described in detail below with reference to the accompanying drawings.

Figure 1:
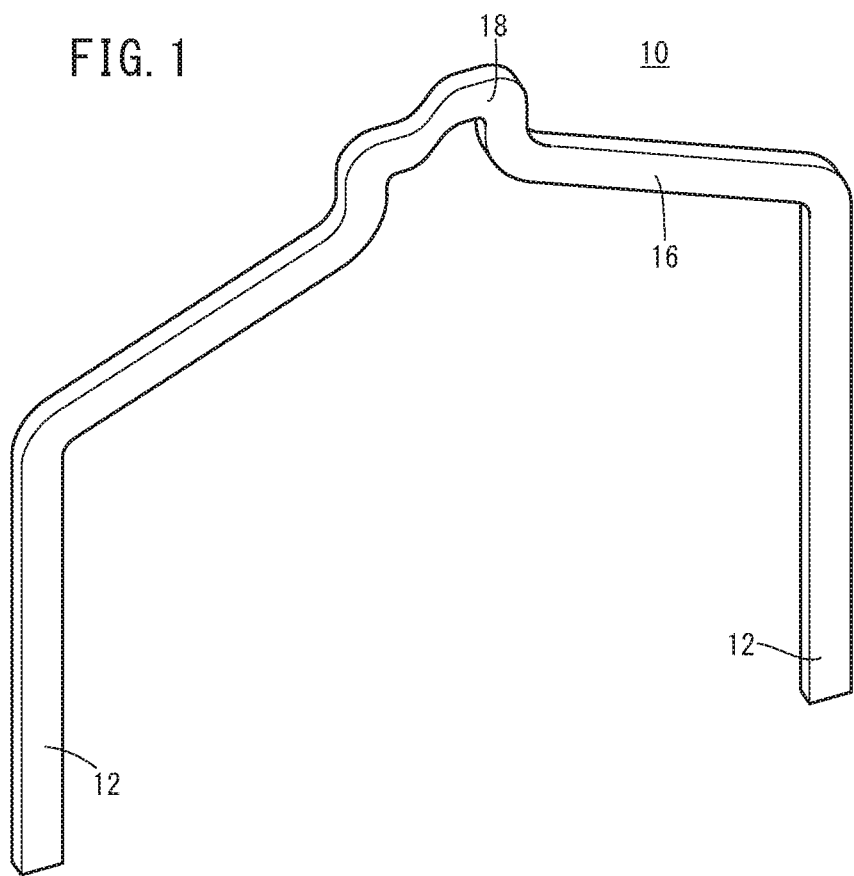
FIG. 1 is a schematic overall perspective view of a conductive wire (a segment) configuring an electromagnetic coil of a stator.

First, a segment 10 (a conductive wire) shown in FIG. 1 and a stator core 20 shown in FIG. 2, will be described. FIG. 1 is a schematic overall perspective view of the segment 10 to be inserted into a slot 22 of the stator core 20 (refer to FIG. 2). The segment 10 includes: two legs 12, 12 extending substantially in parallel to each other; and a turn section 16 interposed between the two legs 12, 12. Due to the turn section 16 bending from one leg 12 toward the other leg 12, the segment 10 is substantially U-shaped.

A crank section 18 of meandering shape is formed in the turn section 16. Due to this crank section 18, a displacement occurs in a direction along a radial direction of the stator core 20, in the segment 10.

Figure 2:
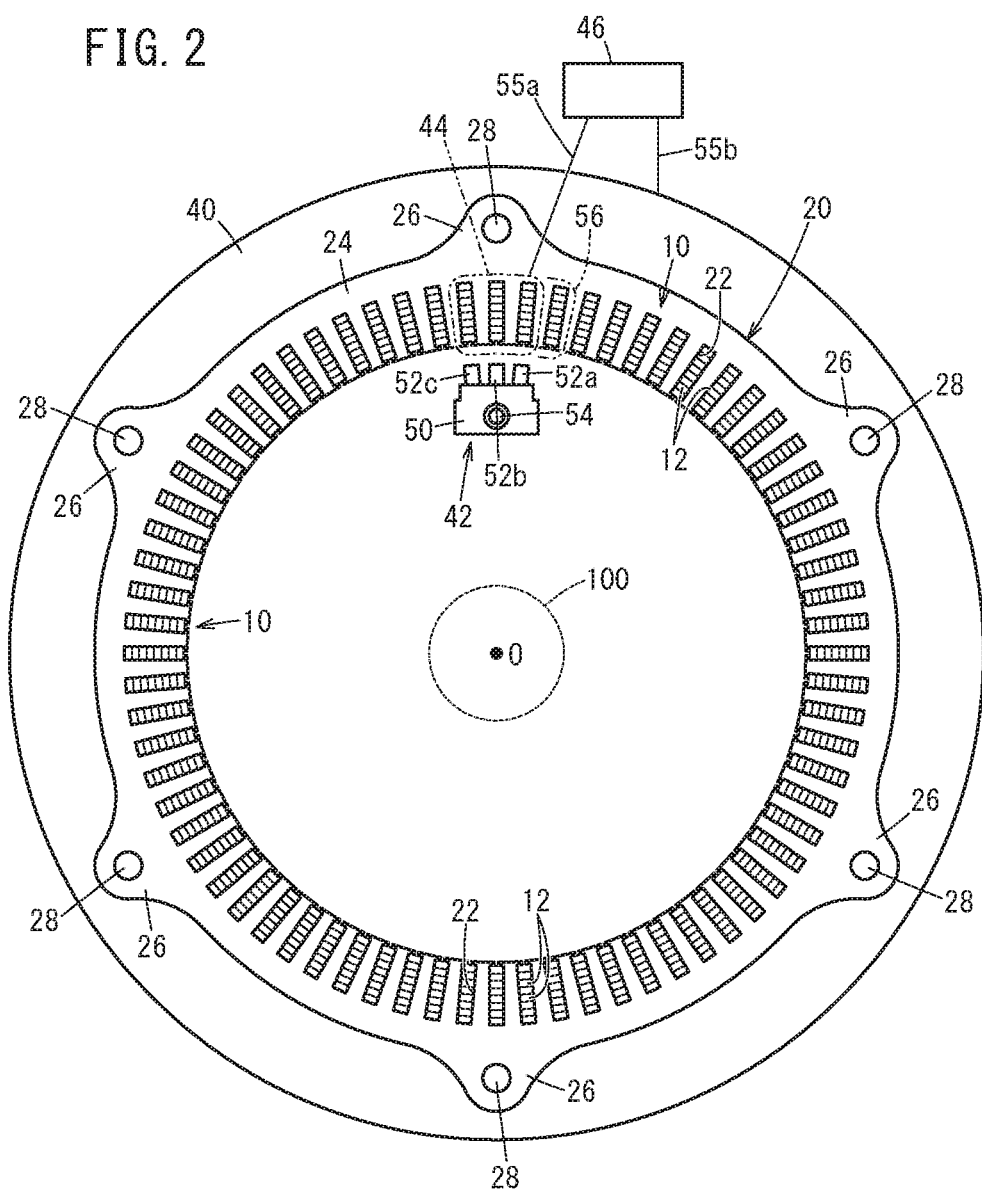
FIG. 2 is a schematic plan view showing both a stator core with the segments of FIG. 1 being inserted into slots thereof, and main parts of a conductive-wire position inspecting device according to an embodiment of the present invention.

The segment 10 having the above shape has one of its legs 12 inserted into one of a plurality of the slots 22 provided in the stator core 20 in FIG. 2, and has its other leg 12 inserted into another one of the slots 22. As a result, the segment 10 becomes an electrical path between the two slots 22. That is, an electrical continuity-enabled state is attained between the slot 22 into which the one leg 12 has been inserted and a different slot 22 into which the other leg 12 has been inserted.

Meanwhile, the stator core 20 is configured as a laminated body having a plurality of core plates laminated therein. Each of the core plates includes: a circular ring section 24; and tab sections 26 projecting from an outer periphery of the circular ring section 24. The slots 22 are formed so as to circle along an inner circumference of the circular ring section 24. Note that a longitudinal direction of the slot 22 is a diametrical direction of the circular ring section 24, hence the slot 22 extends radially.

In addition, each of the tab sections 26 has a fastening hole 28 formed in substantially a center thereof. By an unillustrated bolt passed through this fastening hole 28 being screwed into an unillustrated bolt hole formed in a rotating table 40 (described later) shown in FIG. 2, the laminated core plates are secured and the stator core 20 is positioned and fixed to the rotating table 40.

Next, main parts of a conductive-wire position inspecting device according to the present embodiment will be described with reference to FIG. 2. This conductive-wire position inspecting device includes: the rotating table 40 (a rotating device) on which the stator core 20 is placed; a reference block 42 (a reference body) arranged above the stator core 20 and positioned on an inner circumferential side of the stator core 20 in planar view; a camera 44 as an imaging device; and a computer 46.

The rotating table 40 is rotatable about a point O, under action of a rotary drive motor 100. The stator core 20 with the legs 12 of the segment 10 inserted in the slots 22 is placed on this rotating table 40, and the stator core 20 is subsequently positioned and fixed as described above. Note that the stator core 20 is set in a posture that the legs 12 of the segment 10 face upwardly and the turn section 16 faces downwardly. Moreover, the segment 10 is already twisted.

In this case, the reference block 42 includes a block main body 50 and first through third reference claw sections 52a to 52c. Of these, the block main body 50 is substantially a square body. A supporting shaft 54 attached to an unillustrated supporting body is coupled to the center of the block main body. Therefore, the reference block 42 is supported by the supporting body via the supporting shaft 54.

The first through third reference claw sections 52a to 52c are formed projecting toward an outer side in the radial direction of the stator core 20 from an outer edge section of the block main body 50. That is, an angle made by the adjacent reference claw sections 52a, 52b (or 52b, 52c) matches an angle made by the adjacent slots 22.

The camera 44 is disposed above the stator core 20 and photographs such that upper surfaces of the first through third reference claw sections 52a to 52c and a tip surface of the leg 12 will be within the same image. An image obtained by photographing is sent to the computer 46 via a signal line 55a. Moreover, there is arranged in a vicinity of the camera 44 a laser beam irradiation apparatus 56 for irradiating a vicinity of a photographing range with a laser beam.

The computer 46 serves both as a calculating device and a determining device. That is, the computer 46 calculates and thereby determines whether or not the tip surface of the leg 12 is within a reference range, based on the image photographed by the camera 44.

The rotary drive motor 100 has the computer 46 electrically connected thereto via a signal line 55b, and has the rotating table 40 coupled to its rotary drive shaft. The rotary drive shaft is index-rotated under control action of the computer 46. Along with this index rotation, the rotating table 40 index-rotates integrally with the rotary drive shaft.

The conductive-wire position inspecting device according to the present embodiment is basically configured as above, and next, will be described, concerning its operation and advantageous effects, in relation to a conductive-wire position inspecting method according to the present embodiment.

First, calibration is performed using a calibration master (i.e., a reference element for calibration). That is, the calibration master is disposed in the vicinity of the first through third reference claw sections 52a to 52c of the reference block 42, and the distance from the first through third reference claw sections 52a to 52c to the calibration master is actually measured. In the meantime, the conductive-wire position inspecting device is used to obtain the distance from the first through third reference claw sections 52a to 52c to the calibration master in accordance with the later-mentioned conductive-wire position inspecting method.

Then, a difference between the actually measured distance and the distance obtained by the conductive-wire position inspecting device is calculated. All that is required is a configuration whereby this difference is added as a correction amount to the distance obtained by the conductive-wire position inspecting method. This makes it possible to determine even more accurately whether or not a tip position of the leg 12 of the segment 10 is within a certain reference value range.

Figure 3:
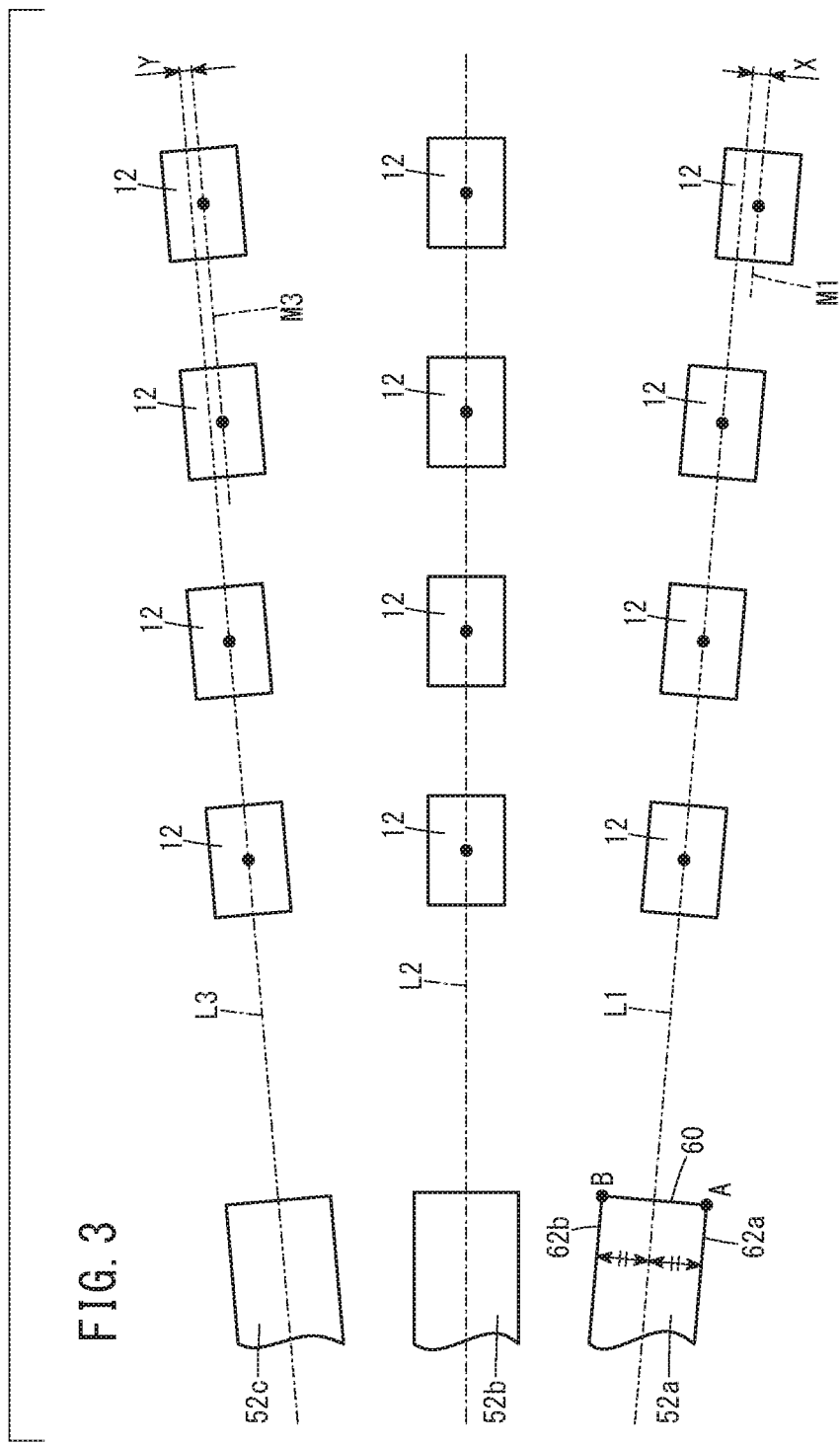
FIG. 3 is an enlarged schematic plan view of main parts showing a method of calculation of a relative position and a relative angle of the segment with respect to a reference body.

Next, in order to implement a conductive-wire position inspection, the stator core 20 is placed on the rotating table 40, and fixedly positioned thereon. At this time, as shown in FIG. 3, each of the three slots 22 and the corresponding one of the first through third reference claw sections 52a to 52c are arranged along a line in the radial direction. That is, a disposing step is implemented. Hereafter, in order to facilitate distinction, the slot 22 that is aligned with the first reference claw section 52a in the radial direction will be referred to as a lower slot 22a, the slot 22 that is aligned with the second reference claw section 52b in the radial direction will be referred to as a middle slot 22b, and the slot 22 that is aligned with the third reference claw section 52c in the radial direction will be referred to as an upper slot 22c. The camera 44 adopts as its photographing range these first through third reference claw sections 52a to 52c and lower through upper slots 22a to 22c.

The laser beam irradiation apparatus 56 irradiates the above-described photographing range with a laser beam. As a result, the photographing range becomes brighter. Meanwhile, the camera 44 photographs (images) the brightly illuminated upper surfaces of the first through third reference claw sections 52a to 52c and tip surface of each of the legs 12 within the lower through upper slots 22a to 22c. In this way, an imaging step is performed.

Next, a calculating step is performed by the computer 46. That is, the computer 46 performs calculation to find first through third reference lines L1 to L3 that extend along the radial direction of the stator core 20, from each of the first through third reference claw sections 52a to 52c. Explaining this specifically exemplifying the first reference claw section 52a and the first reference line L1, the computer 46 first demarcates or determines a vertical side 60 extending substantially in parallel to a circumferential direction of the stator core 20, of the first reference claw section 52a.

Next, the computer 46 determines a first horizontal side 62a and a second horizontal side 62b that extend substantially in parallel to the radial direction of the stator core 20, of the first reference claw section 52a. As a result, an intersection point A of the vertical side 60 and the first horizontal side 62a and an intersection point B of the vertical side 60 and the second horizontal side 62b, are found.

Next, the computer 46 draws a line segment passing through the intersection point A and the intersection point B. A perpendicular bisector of this line segment will be the first reference line L1. The computer 46, substantially simultaneously to finding the first reference line L1, finds the second reference line L2 and the third reference line L3 similarly to as described above.

A position through which each of the thus found first through third reference lines L1 to L3 passes and a position of a center line of each of the legs 12 (a diametrical line of the stator core 20 passing through a center point of each leg 12) within each of the lower through upper slots 22a to 22c, are compared. FIG. 3 shows a state where the second reference line L2 and the center line of the legs 12 within the middle slot 22b coincide, whereas the first reference line L1 and the third reference line L3 are positioned slightly more upwardly than center lines M1 and M3 of some of the legs 12 within the lower slot 22a and the upper slot 22c.

Next, in order to perform a determining step, the computer 46 further calculates whether or not a deviation amount X (a relative position) between the first reference line L1 and the center line of each of the legs 12 within the lower slot 22a is within a preset permissible range (a reference range), and whether or not a deviation amount Y (a relative position) between the third reference line L3 and the center line of each of the legs 12 within the upper slot 22c is within the preset permissible range (the reference range). Furthermore, the computer 46 calculates and thereby finds an angle (a relative angle) made by the center line of each of the legs 12 and the corresponding one of the first through third reference lines L1 to L3.

Then, in order to perform the determining step, the computer 46 determines whether or not the deviation amounts X, Y and the angles, in other words, the relative position and the relative angle of each of the legs 12 with respect to the corresponding one of the first through third reference claw sections 52a to 52c, are within respective permissible ranges. If within the permissible ranges, the computer 46 determines (the positions of) the legs 12 to be "acceptable", and integrally index-rotates the rotary drive shaft and the rotating table 40.

Due to this index-rotation, new three slots 22 become new lower through upper slots 22a to 22c with respect to the first through third reference claw sections 52a to 52c. The legs 12 within these new lower through upper slots 22a to 22c undergo a calculation and determination similar to the above-described. This is repeated, and when (the positions of) all of the legs 12 are determined to be acceptable, the stator core 20 is conveyed to a joining station where the legs 12 are joined together. In contrast, the leg 12 that is determined to be unacceptable undergoes a re-disposing in order to set its deviation amount within the permissible range.

Thus, in the present embodiment, it can be simultaneously determined whether or not positions of the legs 12 within a plurality of the slots 22 are within the reference range, merely by performing a simple calculation. That is, a time required for position inspection of all of the legs 12 can be reduced in comparison with conventional technology. Therefore, efficiency of the position inspection rises.

Figure 4:
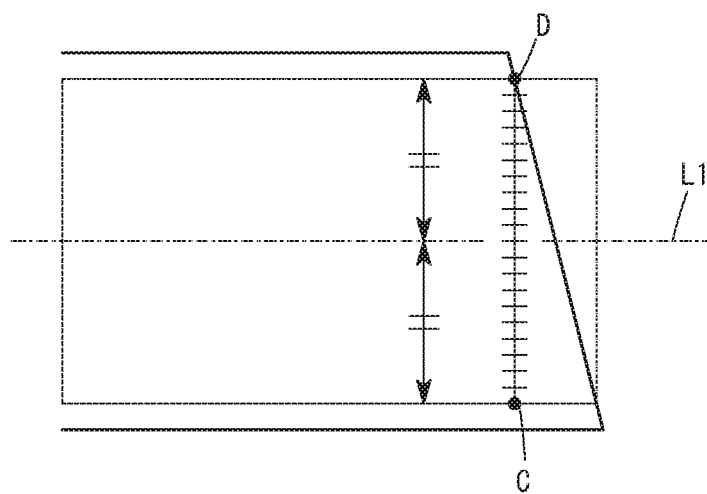
FIG. 4 is an enlarged schematic plan view of main parts showing a method of correction when a perpendicular side cannot be found in an image of the reference body.

Note that there may occur an image where corners of the first through third reference claw sections 52a to 52c are inclined due to the likes of diffused reflection or ghosting. Accordingly, a configuration may be adopted whereby when the computer 46 performs calculation, a portion excluding the corners is extracted from the vertical side 60, as between C and D in FIG. 4. In this case, there should be a configuration whereby subsequently, the extracted portion is divided into equal intervals and averaged to find the vertical side 60.

Alternatively, a configuration may be adopted whereby a lens of the camera 44 is provided beforehand with the first through third reference lines L1 to L3. In this case, the computer 46 only has to calculate deviation amounts of the first through third reference lines L1 to L3 and the center lines of the legs 12 within the lower through upper slots 22a to 22c. Therefore, even more reduction of the time required for inspection or even further improvement of inspection efficiency can be achieved. There may also be a configuration whereby the first through third reference lines L1 to L3 are provided to a transparent body, instead of to the lens of the camera 44, and this transparent body is interposed between the camera 44 and the reference block 42.

The present invention is not particularly limited to the above-described embodiment, and a variety of changes are possible in a range not departing from the scope of the present invention.

For example, although the above-described embodiment is configured such that the stator core 20 is set in a posture that the legs 12 face upwardly and the turn section 16 faces downwardly, and the reference block 42 and camera 44 are arranged above the legs 12, it may be configured oppositely to this. That is, it is also possible to adopt a posture where the legs 12 face downwardly and the turn section 16 faces upwardly, and the reference block 42 and camera 44 are arranged below the legs 12. In this case, a configuration may be adopted whereby the rotating table 40 is provided with the likes of gripping claws that grip the stator core 20.

In addition, a configuration may be adopted whereby the reference block 42 is arranged on an outer circumferential side of the stator core 20. In this case, the reference line may be drawn toward the leg 12 positioned on the outermost side within the slot 22.

Moreover, the number of reference claw sections provided in the reference block 42 is not particularly limited to three, and there may be, for example, five or more. Furthermore, the number of reference claw sections may correspond to the number of slots 22. In the latter case, a configuration may be adopted whereby the camera 44 and the laser beam irradiation apparatus 56 are revolved along the circumferential direction of the stator core 20.

What is claimed is:

1. A conductive-wire position inspecting method for inspecting positions of a plurality of conductive wires inserted into a slot of a stator core and arranged in a radial direction of the stator core, the method comprising:
    a disposing step of disposing a reference body so that the reference body and the conductive wires projecting from the slot are arranged along a line in the radial direction of the stator core;
    an imaging step of imaging the conductive wires and the reference body with an imaging device;
    a calculating step of finding a deviation amount of each of the conductive wires with respect to a reference line drawn from the reference body and extended along the radial direction of the stator core, based on an image obtained by the imaging device; and
    a determining step of, if the deviation amount found in the calculating step falls within a permissible range, determining the position of the conductive wire to be acceptable.

2. The conductive-wire position inspecting method according to claim 1, wherein
    the conductive wires comprise a plurality of conductive wires that are arranged along a circumferential direction of the stator core, and
    after the position of one of the conductive wires is determined to be acceptable in the determining step, another one of the conductive wires that is adjacent to the one conductive wire in the circumferential direction undergoes the imaging step, the calculating step, and the determining step.

3. A conductive-wire position inspecting device for inspecting a position of a plurality of conductive wires inserted into a slot of a stator core and arranged in a radial direction of the stator core, the device comprising:
    a reference body disposed so that the reference body and the conductive wire projecting from the slot are arranged along a line in the radial direction of the stator core;
    an imaging device configured to image the conductive wires and the reference body;
    a calculating device configured to find a deviation amount of each of the conductive wires with respect to a reference line drawn from the reference body and extended along the radial direction of the stator core, based on an image obtained by the imaging device; and
    a determining device configured to, if the deviation amount found by the calculating device falls within a permissible range, determine the position of the conductive wire to be acceptable.

4. The conductive-wire position inspecting device according to claim 3, further comprising
a rotating device configured to rotate the stator core relatively to the imaging device and the reference body.

5. The conductive-wire position inspecting device according to claim 3, wherein
the imaging device and the reference body is positioned and fixed.

6. The conductive-wire position inspecting device according to claim 3, wherein
the reference line is provided in the imaging device or a member interposed between the imaging device and the reference body.

* * * * *